US006389708B1

(12) United States Patent
Christensen

(10) Patent No.: US 6,389,708 B1
(45) Date of Patent: May 21, 2002

(54) TAB AND SLOT DESIGN OPTIMIZED FOR BLIND ALIGNMENT OF COMPONENTS

(75) Inventor: Steven Michael Christensen, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 09/659,096

(22) Filed: Sep. 11, 2000

(51) Int. Cl.⁷ ................................................. B23Q 3/00
(52) U.S. Cl. ............................. 33/645; 33/520; 33/644
(58) Field of Search ..................... 33/645, 520, 613, 33/533, 614, 621, 623, 644

(56) References Cited

U.S. PATENT DOCUMENTS

| | | | | |
|---|---|---|---|---|
| 2,793,442 A | * | 5/1957 | Ozga | 33/623 |
| 3,196,549 A | * | 7/1965 | Alexander | 33/520 |
| 3,253,339 A | * | 5/1966 | Capkovic | 33/623 |
| 3,918,694 A | * | 11/1975 | Laudick | 33/623 |
| 4,553,334 A | * | 11/1985 | Fell | 33/549 |
| 5,138,772 A | * | 8/1992 | Barnes | 33/613 |
| 5,970,621 A | * | 10/1999 | Bazydola et al. | 33/533 |
| 5,992,028 A | * | 11/1999 | Wing | 33/613 |
| 5,992,816 A | * | 11/1999 | Yoshida et al. | 33/655 |

* cited by examiner

Primary Examiner—Christopher W. Fulton
(74) Attorney, Agent, or Firm—Mark E. McBurney; Bracewell & Patterson, L.L.P.

(57) ABSTRACT

An alignment system has one or more paired tabs and slots. The tabs are located on one component and the slots are located in another component to provide alignment between the components in three dimensions even if the tabs and slots are beyond the view or not visible to the user. The tab is a flat protrusion having short side edges and tapered front edges that converge to a central tip. The slot is a large, generally diamond-shaped aperture with rectangular slits on two opposed corners. Initially, the tabs on the first component are misaligned in three dimensions relative to the slots in the second component. As the tips of the tabs move into the slots, the tips make contact with the diamond-shaped apertures. The large size and shape of the slots allow for a significant range of misalignment between the components. After initial capture, the tapered front edges of the tabs slide along the apertures to provide coarse deflection and centering. As the tabs plunge deeper into the slots, the width of the tabs exceeds the width of the apertures and eventually the tabs center in the rectangular slits.

20 Claims, 4 Drawing Sheets

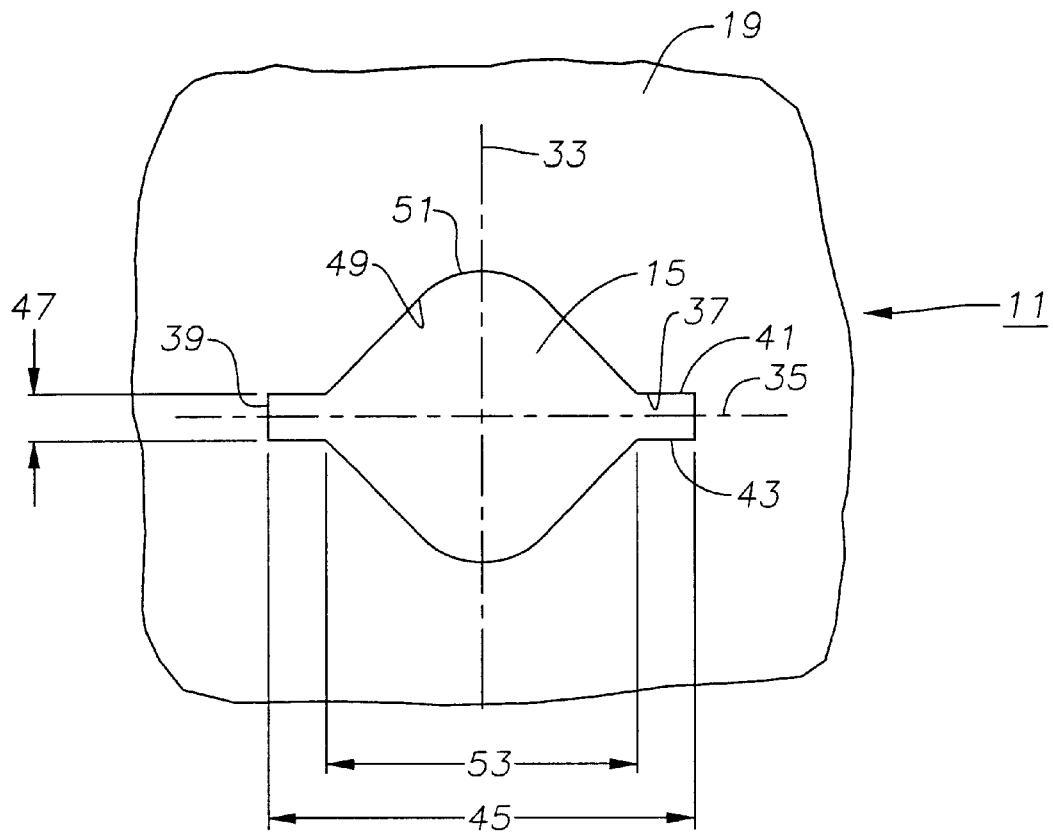
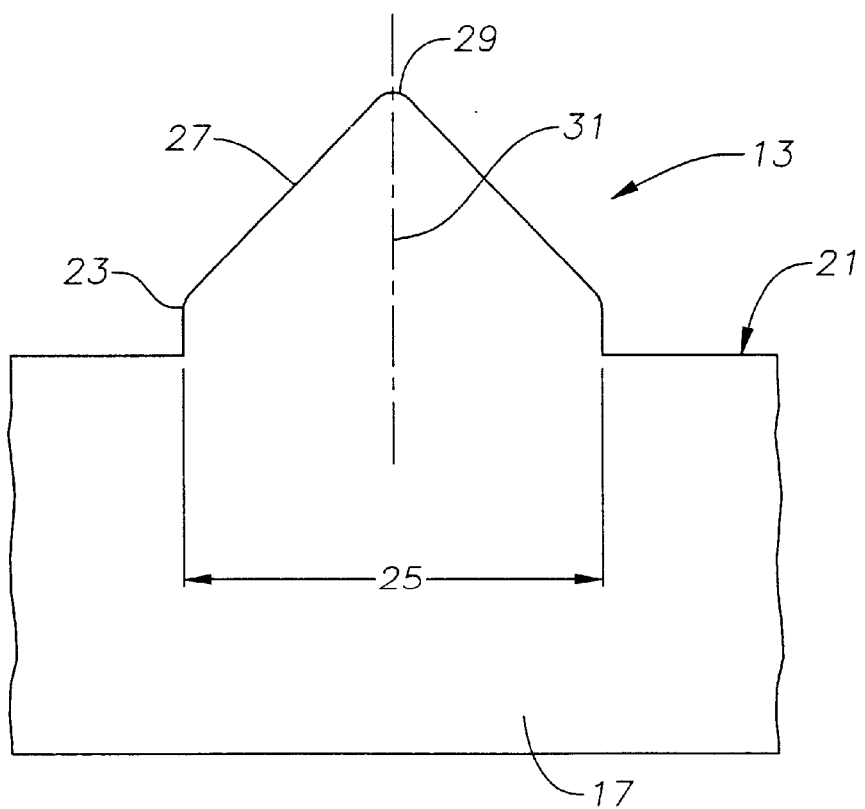
Fig. 1

TAB AND SLOT DESIGN OPTIMIZED FOR BLIND ALIGNMENT OF COMPONENTS

BACKGROUND OF THE INVENTION

1. Technical Field

The present invention relates in general to an improved tab and slot design, and in particular to blindly aligning a tab into a slot. Still more particularly, the present invention relates to a tab and slot design for aligning two perpendicular, planar bodies in three-dimensional space while the tab and slot are not in view.

2. Description of the Prior Art

The alignment of similarly-shaped components may be achieved through the use of secondary "pin and socket" hardware that is specifically designed for such purposes. In the computer and electronics industry, locating pins and sockets are sometimes an integral part of the connector systems used to electrically interconnect the components. For example, the connector systems used to interconnect motherboards and daughterboards typically utilize devices that are permanently mounted on the boards. However, the quality of such connector systems vary, as does the quality of the alignment hardware or guidance system they employ.

Some mating components require manufacturing and/or service personnel to locate and align their respective connector systems "blindly" or while their connector systems are not in view. This is frequently a difficult and time-consuming maneuver since the components typically require alignment in three dimensions. The accurate alignment of two perpendicular planar bodies, such as a motherboard and daughterboard, may be carried out with the use of simple features that are designed into the planar parts. The alignment may require additional hardware such as a guide pin and guidance socket or receptacle. Although these alignment mechanisms provide fairly reliable results, they may not be cost effective or available for some applications. Thus, the universal ability to repeatably blind-locate and align two mating components in three dimensions would be a significant benefit to both the manufacturing and field service sectors. This ability is becoming increasingly important as the trend continues toward quick, easy assembly and disassembly of components.

SUMMARY OF THE INVENTION

An alignment system has one or more paired tabs and slots. The tabs are located on one component and the slots are located in another component to provide alignment between the components in three dimensions even if the tabs and slots are beyond the view or not visible to the user. The tab is preferably a flat protrusion having short side edges and tapered front edges that converge to a central tip. The slot is preferably a large, generally diamond-shaped aperture with rectangular slits on two opposed corners. The alignment system utilizes the paired tabs and slots to align two perpendicular components.

Initially, the tabs on the first component are misaligned in three dimensions relative to the slots in the second component. As the tips of the tabs move into the slots, the tips make contact with the diamond-shaped apertures. The large size and shape of the slots allow for a significant range of misalignment between the components. After initial capture, the tapered front edges of the tabs slide along the apertures to provide coarse deflection and centering. As the tabs plunge deeper into the slots, the width of the tabs exceeds the width of the apertures and eventually the tabs center in the rectangular slits. The tabs stop when the first component abuts the planar surface of the second component.

The foregoing and other objects and advantages of the present invention will be apparent to those skilled in the art, in view of the following detailed description of the preferred embodiment of the present invention, taken in conjunction with the appended claims and the accompanying drawings.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

FIG. 1 is a front view of a tab and slot design constructed in accordance with the present invention.

DETAILED DESCRIPTION OF THE PREFERRED EMBODIMENT

Figure 2:
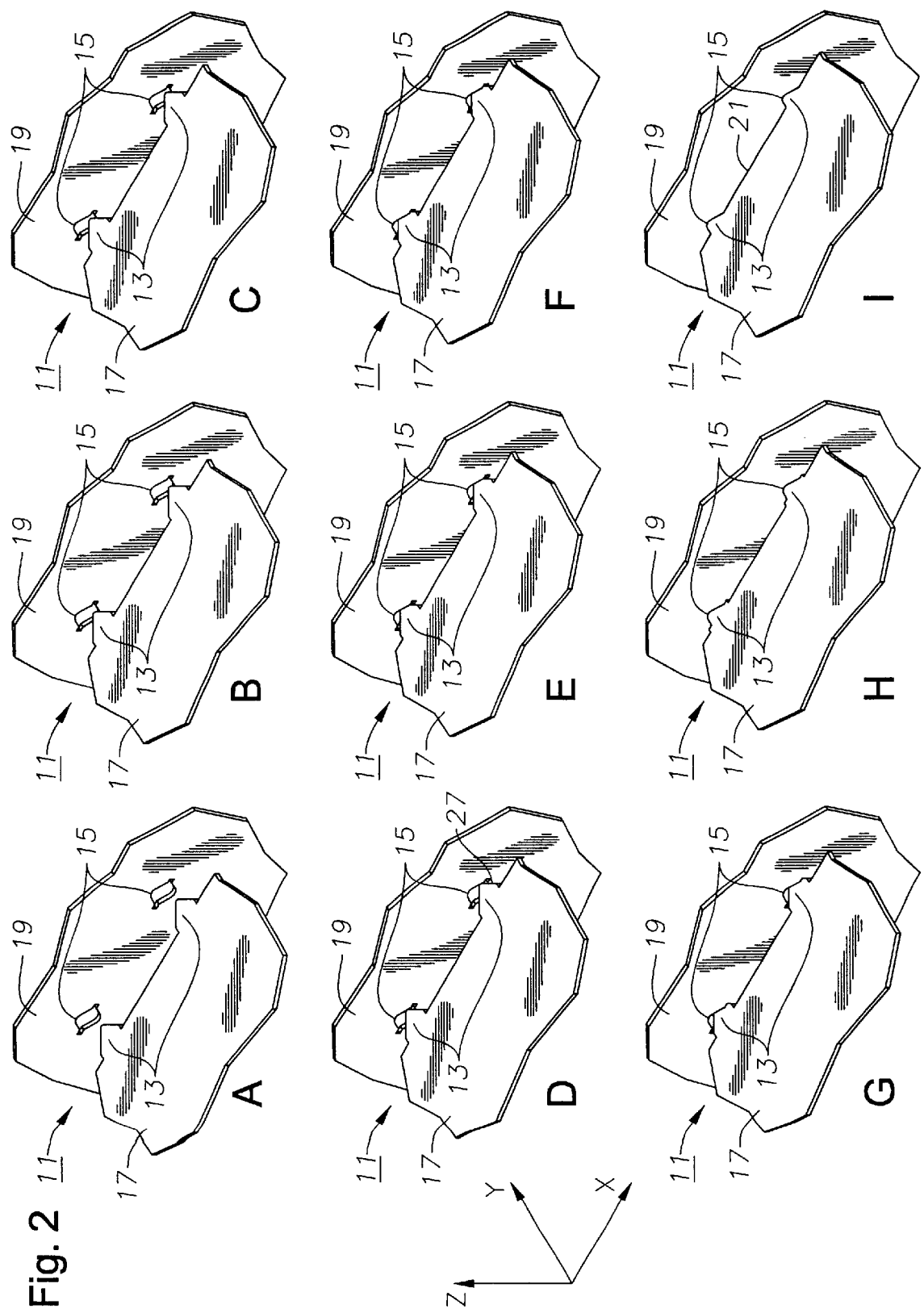
FIGS. 2A–2I are sequential isometric views of the tab and slot design of FIG. 1 during the engagement process.

Referring to FIG. 1, an alignment system 11 comprising at least one paired male portion or tab 13 and a female portion or slot 15 is shown. In the embodiment illustrated, tab 13 is integrally formed on a first component 17, and slot 15 is integrally formed in a second component 19. Tab 13 is a generally flat protrusion with a nominal thickness and extends from a backstop edge 21 of first component 17. Tab 13 has a pair of parallel, relatively short side edges 23 that define a neck having a width dimension 25. Side edges 23 are perpendicular to edge 21. Each side edge 23 transitions into a head having tapered front edges 27 that are diagonally oriented relative to edges 21, 23 at approximately 45 degrees. In the version shown, front edges 27 are orthogonal to each other. Front edges 27 converge toward each other to a centrally located, slightly rounded tip 29, to give tab 13 a symmetrical shape about a bisecting axis 31. The maximum width of front edges 27 is equal to width dimension 25 of the neck.

Slot 15 is essentially a uniquely configured aperture in second component 19. For reference purposes, slot 15 is provided with a set of perpendicular axes 33, 35. Slot 15 has a generally rectangular slit 37 on each of its sides. Each rectangular slit 37 has one lateral edge 39, and a pair of longitudinal edges 41, 43. The lateral edges 39 of rectangular slits 37 are parallel and define a rectangular slit width 45. The longitudinal edges 41, 43 of rectangular slits 37 also are parallel and define a rectangular slit thickness 47. Width 45 is equal to or slightly greater than width 25 of tab 13, and thickness 47 is equal to or slightly greater than the nominal thickness of tab 13. The remainder of slot 15 is defined by a pair of generally hyperbolic apertures 49, each having a well-rounded apex 51. Like front edges 27 of tab 13, hyperbolic apertures 49 have an angular displacement of approximately 90 degrees. Together, the two hyperbolic apertures give slot 15 a generally diamond-shaped appearance with the two rectangular slits 45 on opposed corners. The maximum width 53 of hyperbolic apertures 49 is less than the width 25 of the neck on tab 13. Apexes 51 have a greater radius of curvature than tip 29 on tab 13. In the embodiment shown, slot 15 is symmetrical about both bisecting axes 33, 35. Thus, apexes 51 of hyperbolic apertures 49 are centered about axis 33, and rectangular slits 41 are centered along axis 35.

In operation, alignment system 11 enables two components that are misaligned in up to three dimensions to be aligned and interconnected even if the user is "blind" and/or the alignment system 11 is not within the view of the user. In this disclosure, the term "blind" refers to the inability of a user, operator, or assembler to visually perceive the alignment system or the relative positions of the elements of the alignment system. Alignment system 11 may be provided with one or more paired tabs 13 and slots 15. For purposes of illustration, two pairs of tabs 13 and slots 15 are shown in the step-wise FIGS. 2A through 2I. FIG. 2A represents initial misalignment and FIG. 2I represents full alignment. In this sequential rendering of the aligning process, two tabs 13 are provided on first component 17 and two slots 15 are provided on second component 19. Components 17 and 19 are perpendicular to each other and their respective tabs 13 and slots 15 lie within the planes that they define. Although components 17, 19 are shown and described as perpendicular, they are not required to be so. In other words, alignment system 11 is able to accommodate angles of pitch between components 17, 19 when they are not perpendicular. The centers of the tabs 13 on first component 17 are spaced apart by the same distance as the centers of the slots 15 in second component 19.

To assist in an understanding of the invention, the following table provides a numerical analysis (in generic "units") of the graphical sequence depicted in FIGS. 2A through 2I (a Cartesian coordinate system is provided on the left side of the drawings). Initially, first component 17 is misaligned 1.4 units too far to the right (x), 13.3 units too far back (y), and 3.1 units too low (z).

| FIG. | x (units) | y (units) | z (units) |
|---|---|---|---|
| 2A | 1.4 | −13.3 | −3.1 |
| 2B | 1.4 | −8.3 | −3.1 |
| 2C | 1.4 | −7.3 | −2.1 |
| 2D | 1.4 | −6.3 | −1.1 |
| 2E | 1.4 | −5.3 | −0.1 |
| 2F | 1.4 | −4.3 | 0 |
| 2G | 1.4 | −3.3 | 0 |
| 2H | 0 | −1.3 | 0 |
| 2I | 0 | 0 | 0 |

In FIG. 2A, tabs 13 on first component 17 are completely spaced apart from and misaligned in three dimensions relative to slots 15 in second component 19. In FIG. 2B, tabs 13 have moved several units closer to slots 15 in the y-direction and made initial contact on the lower right sides of the lower hyperbolic apertures 49 of slots 15. At this stage, only tips 29 of tabs 13 are captured in slots 15. Note that the large overall size and shape of apertures formed by slots 15 allow for a significant range of misalignment between components 17, 19. After initial capture (FIG. 2C), the tapered front edges 27 of tabs 13 sliding along hyperbolic apertures 49 provide coarse deflection and centering of components 17, 19. As tabs 13 are plunged deeper into slots 15 (FIG. 2D), the width of the front edges 27 of tabs 13 penetrating slots 15 eventually exceeds the maximum width 53 (FIG. 1) of hyperbolic apertures 49 (FIGS. 2E and 2F). This stage of the process provides the first dimensional alignment wherein the thickness 47 (FIG. 1) of rectangular slits 37 is sized to the thickness of tabs 13.

As tabs 13 are pushed further into slots 15 (FIG. 2G), tapered front edges 27 center tabs 13 into rectangular slits 37 until the second dimensional alignment occurs (FIG. 2H) between the width 45 (FIG. 1) of slits 37 and width 25 of tabs 13. Finally, as shown in FIG. 2I, side edges 23 on the neck of tabs 13 engage slits 37 and backstop edge 21 of first component 17 abuts or "bottoms out" against the planar surface of second component 19, providing a positive stop for the third dimensional alignment.

Figure 3:
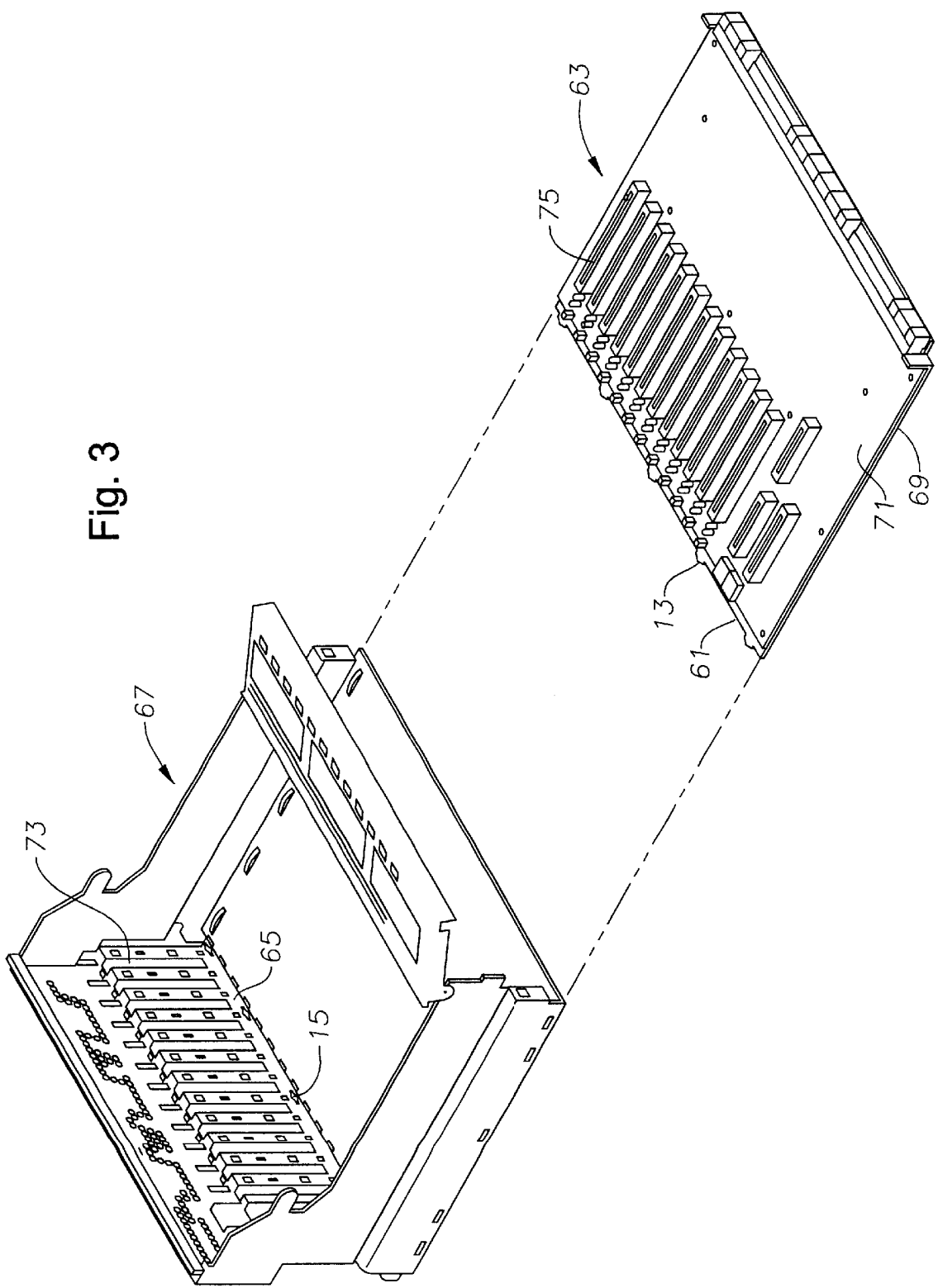
FIG. 3 is an isometric view of an illustrative application for the tab and slot design of FIG. 1 including a sheet assembly and a shuttle assembly equipped with the tab and slot design and is shown prior to engagement.
Figure 4:
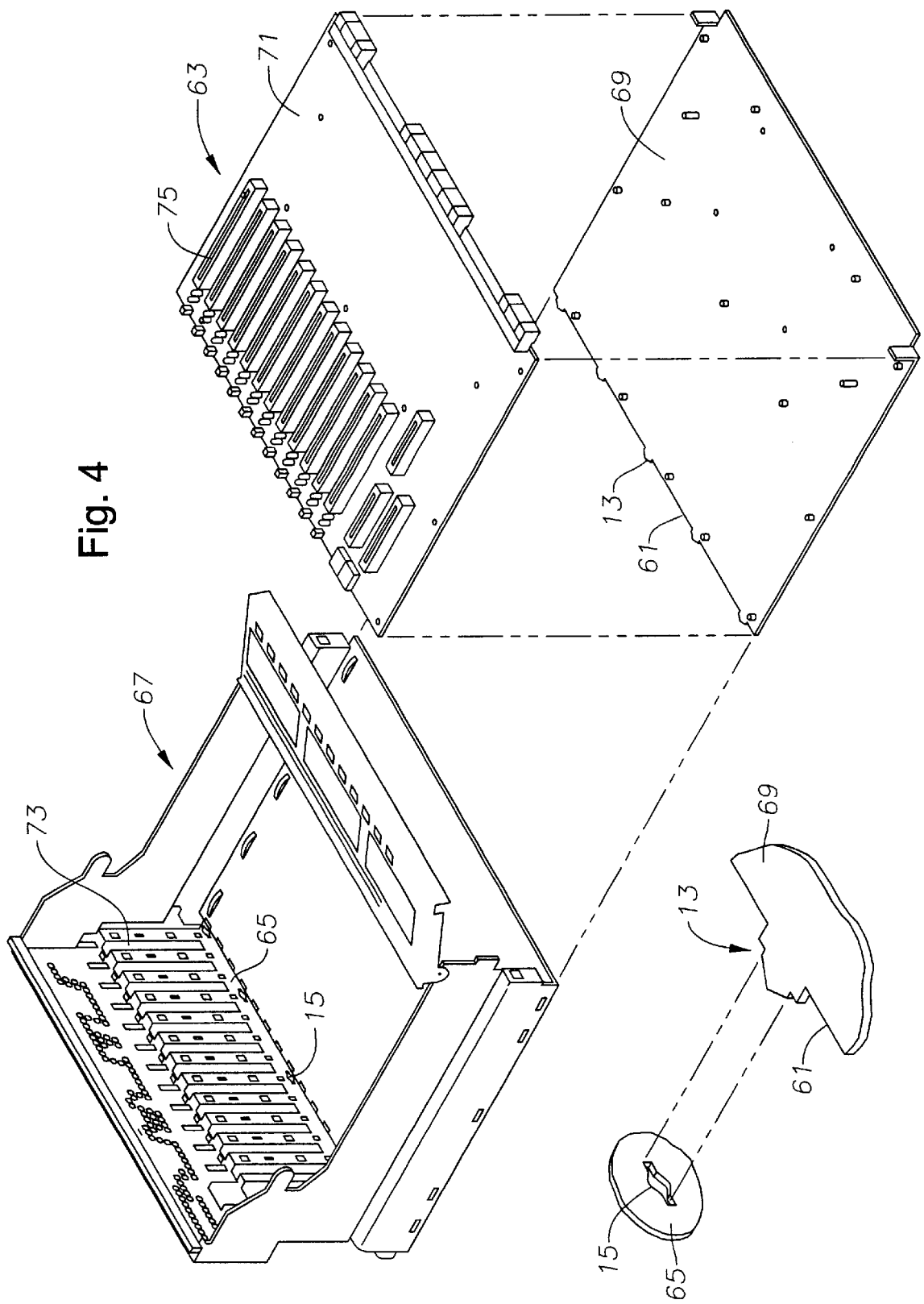
FIG. 4 is an exploded isometric view of the illustrative application of FIG. 3 having the tab and slot design of FIG. 1 and is shown prior to engagement.

An application for alignment system 11 is depicted in FIGS. 3 and 4. In this example, tabs 13 are provided along the front edge 61 of a board assembly 63, and slots 15 are provided in the frame 65 of a shuttle assembly 67. Board assembly 63 includes a sheet metal plate 69 (FIG. 4) and a motherboard 71. Motherboard 71 is secured to plate 69 prior to the alignment process. Board assembly 63 is inserted into or slid into shuttle assembly 67 to initiate the alignment process. As tabs 13 on board assembly 63 near their respective and mating slots 15 in frame 65, the alignment sequence progresses as illustrated in FIGS. 2A through 2I, described above. After board assembly 63 is aligned by alignment system 11 and secured to shuttle assembly 67, tabs 13 and slots 15 provide precise alignment for adapter cards (not shown) that insert through holes 73 in frame 65 and plug into sockets 75 in the planar motherboard 71.

The present invention has several advantages. The tab and slot design of the present invention allows a user or operator to mechanically align and connect components even though the connection elements are not in the user's view. The present tab and slot design provides for complete three-dimensional correction of misaligned components. Although tab and slot locators are generally not new, especially in the sheet metal business where they are used extensively to locate multiple sheet metal items in the same weldment, the present design is differentiated from conventional square tab and slot locators since it locates two mating items blindly and repeatably. Such a design is commonly necessary in high volume manufacturing environments, or simply as a consideration for end users or service technicians. The present invention eliminates the necessity, cost, and complexity of additional hardware by incorporating features into the planar surfaces themselves that allow for three-dimensional blind alignment. The present design provides a simple and accurate locating method that is less expensive than mechanisms requiring additional hardware. In addition, cost savings are also realized via improved manufacturing yield as bent pins and damaged raw cards are reduced.

While the invention has been shown or described in only some of its forms, it should be apparent to those skilled in the art that it is not so limited, but is susceptible to various changes without departing from the scope of the invention.

What is claimed is:

1. An alignment system for providing blind alignment between components in three dimensions, comprising:
   a first component having a tab protruding therefrom with a neck and a tapered head;
   a second component having a slot with a generally diamond-shaped aperture and opposed slits; and
   wherein as the tab is inserted into the slot, the tapered head engages the diamond-shaped aperture to provide alignment in a first dimension, the neck centers the tab in the slits to provide alignment in a second dimension, and the first component abuts the second component to provide alignment in a third dimension even when the tab and the slot are out of view of a user.

2. The alignment system of claim 1 wherein the tab is generally flat to define a first plane and the slot defines a second plane that is substantially perpendicular to the first plane.

3. The alignment system of claim 1 wherein the neck of the tab has two parallel side edges and the tapered head has edges that are diagonal to the side-edges of the neck.

4. The alignment system of claim 1 wherein edges of the tapered head are oriented at approximately 90 degrees relative to each other.

5. The alignment system of claim 1 wherein the tab has a rounded tip with a first radius of curvature and the diamond-shaped aperture has two rounded corners each with a second radius of curvature that is greater than the first radius of curvature.

6. The alignment system of claim 1 wherein each of the tab and the aperture are symmetrical.

7. The alignment system of claim 1 wherein the tab is symmetrical about a single axis and the slot is symmetrical about two perpendicular axes.

8. The alignment system of claim 1 wherein a width of the slot at the slits is slightly greater than a width of the tab at the neck.

9. The alignment system of claim 1 wherein a thickness of the slot at the slits is slightly greater than a thickness of the tab.

10. The alignment system of claim 1 wherein a maximum width of the diamond-shaped aperture of the slot is less than a width of the tab at the neck.

11. The alignment system of claim 1 wherein as the tab is inserted into the slot, a width of the tapered head exceeds a width of the diamond-shaped aperture to provide alignment in the first dimension, the tapered head centers the tab in the rectangular slits to provide alignment in the second dimension, and a backstop edge of the first component abuts a surface of the second component to provide a positive stop and alignment in the third dimension.

12. An alignment system for providing blind, three dimensional alignment between perpendicular components, comprising:
a first component having a first plane and a symmetrical, substantially flat tab protruding therefrom, the tab having a neck with two parallel side edges and a tapered head with edges that are diagonal to the side edges of the neck;
a second component having a second plane that is substantially perpendicular to the first plane, and a slot that is symmetrical about two perpendicular axes, the slot having a generally diamond-shaped aperture with two opposed slits therein; and wherein
as the tab is inserted into the slot, a width of the tapered head exceeds a width of the diamond-shaped aperture to provide alignment in a first dimension, the tapered head centers the tab in the rectangular slits to provide alignment in a second dimension, and the first component abuts the second component to provide alignment in a third dimension even when the tab and the slot are out of view of a user.

13. The alignment system of claim 12 wherein the edges of the tapered head are oriented at approximately 90 degrees relative to each other.

14. The alignment system of claim 12 wherein the tab has a rounded tip with a first radius of curvature and the diamond-shaped aperture has two rounded corners each with a second radius of curvature that is greater than the first radius of curvature.

15. The alignment system of claim 12 wherein a width of the slot at the slits is slightly greater than a width of the tab at the neck.

16. The alignment system of claim 12 wherein a thickness of the slot at the slits is slightly greater than a thickness of the tab.

17. The alignment system of claim 12 wherein a maximum width of the diamond-shaped aperture of the slot is less than a width of the tab at the neck.

18. An alignment system for providing blind, three dimensional alignment between perpendicular components, comprising:
a first component having a first plane, a first edge, and a symmetrical, substantially flat tab protruding from the first edge that is generally coplanar with the first plane, the tab having a neck with two parallel side edges and a tapered head with edges that are diagonal to the side edges of the neck;
a second component having a second plane that is substantially perpendicular to the first plane, and a slot that is generally coplanar with the second plane and symmetrical about two perpendicular axes, the slot having an aperture with two opposed, generally hyperbolic shapes and two opposed, rectangular slits located at the intersections of the hyperbolic shapes; wherein
a width of the slot at the rectangular slits is greater than a width of the tab at the neck, a thickness of the slot at the rectangular slits is greater than a thickness of the tab, and a maximum width of the aperture is less than the width of the tab at the neck; and wherein
as the tab is inserted into the slot, a maximum width of the tapered head exceeds a maximum width of the aperture to provide alignment in a first dimension, the tapered head centers the tab in the rectangular slits to provide alignment in a second dimension, and the first edge of the first component abuts the second component to provide alignment in a third dimension even when the tab and the slot are out of view of a user.

19. The alignment system of claim 18 wherein the edges of the tapered head are oriented at approximately 90 degrees relative to each other.

20. The alignment system of claim 18 wherein the tab has a rounded tip with a first radius of curvature and the aperture has two rounded corners each with a second radius of curvature that is greater than the first radius of curvature.

* * * * *